United States Patent
Yamoto et al.

(10) Patent No.: US 7,089,517 B2
(45) Date of Patent: *Aug. 8, 2006

(54) METHOD FOR DESIGN VALIDATION OF COMPLEX IC

(75) Inventors: Hiroaki Yamoto, Santa Clara, CA (US); Rochit Rajsuman, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 601 days.

This patent is subject to a terminal disclaimer.

(21) Appl. No.: 09/941,396

(22) Filed: Aug. 28, 2001

(65) Prior Publication Data

US 2002/0040288 A1   Apr. 4, 2002

Related U.S. Application Data

(60) Provisional application No. 60/237,001, filed on Sep. 29, 2000.

(51) Int. Cl.
*G06F 17/50*   (2006.01)

(52) U.S. Cl. .............................. 716/5; 716/4; 714/736; 714/738; 703/16; 703/17; 703/20

(58) Field of Classification Search ................ 716/4–6, 716/13–17; 714/724–746
See application file for complete search history.

(56) References Cited

U.S. PATENT DOCUMENTS

| | | | | |
|---|---|---|---|---|
| 5,371,851 A | * | 12/1994 | Pieper et al. | 345/501 |
| 5,740,086 A | * | 4/1998 | Komoto | 702/120 |
| 6,006,022 A | * | 12/1999 | Rhim et al. | 716/1 |
| 6,651,204 B1 | * | 11/2003 | Rajsuman et al. | 714/738 |
| 6,668,331 B1 | * | 12/2003 | Gomes et al. | 713/401 |

OTHER PUBLICATIONS

Michael Keating "Reuse Methodology Manual", 1999 , pp. 1~9 and pp. 229~251, Kluwer Academic Publishers.
Rochit Rajsuman "System-on-a-Chip: Design and Text" pp. 1~31, pp. 125~153, 2000 Artech House.

* cited by examiner

*Primary Examiner*—Vuthe Siek
(74) *Attorney, Agent, or Firm*—Muramatsu & Associates (57) ABSTRACT

A method for design validation of complex IC with use of a combination of electronic design automation (EDA) tools and a design test station at high speed and low cost. The EDA tools and device simulator are linked to the event based test system to execute the original design simulation vectors and testbench and make modifications in the testbench and event based test vectors until satisfactory results are obtained. The event based test vectors are test vectors in an event format in which an event is any change in a signal which is described by its timing and the event based test system is a test system for testing an IC by utilizing the event based test vectors. Because EDA tools are linked with the event based test system, these modifications are captured to generate a final testbench that provides satisfactory results.

19 Claims, 7 Drawing Sheets

METHOD FOR DESIGN VALIDATION OF COMPLEX IC

This application claims the benefit of Provisional Patent Application No. 60/237,001 filed Sep. 29, 2000.

FIELD OF THE INVENTION

This invention relates to a method for design validation of complex IC, and more particularly, to a method for evaluating and validating the design of a complex IC such as a system-on-a-chip with use of a combination of electronic design automation (EDA) tools and an event based test system with high speed and low cost.

BACKGROUND OF THE INVENTION

At the present time, VLSI design is described in blocks and sub-blocks using a high-level language such as Verilog or VHDL and simulated by behavioral, gate-level Verilog/VHDL simulators. Such simulation is targeted to check the functionality and performance before the design is fabricated into silicon IC.

Design validation is one of the most important and difficult tasks in complex IC design because without full functional verification, design errors are not found and removed. At the same time, design validation is an absolute necessity in the product development cycle. Because of the slow simulation speed and large size of present day designs, chip level design validation is almost an impossible task with the present day tools and methodologies (M. Keating and P. Bricaud, "Reuse methodology manual for system-on-a-chip design", Kluwer Academic publishers, 0-7923-8175-0, 1998; R. Rajsuman, "System-on-a-Chip: Design and Test", Artech House Publishers Inc., ISBN 1-58053-107-5, 2000).

Figure 1:
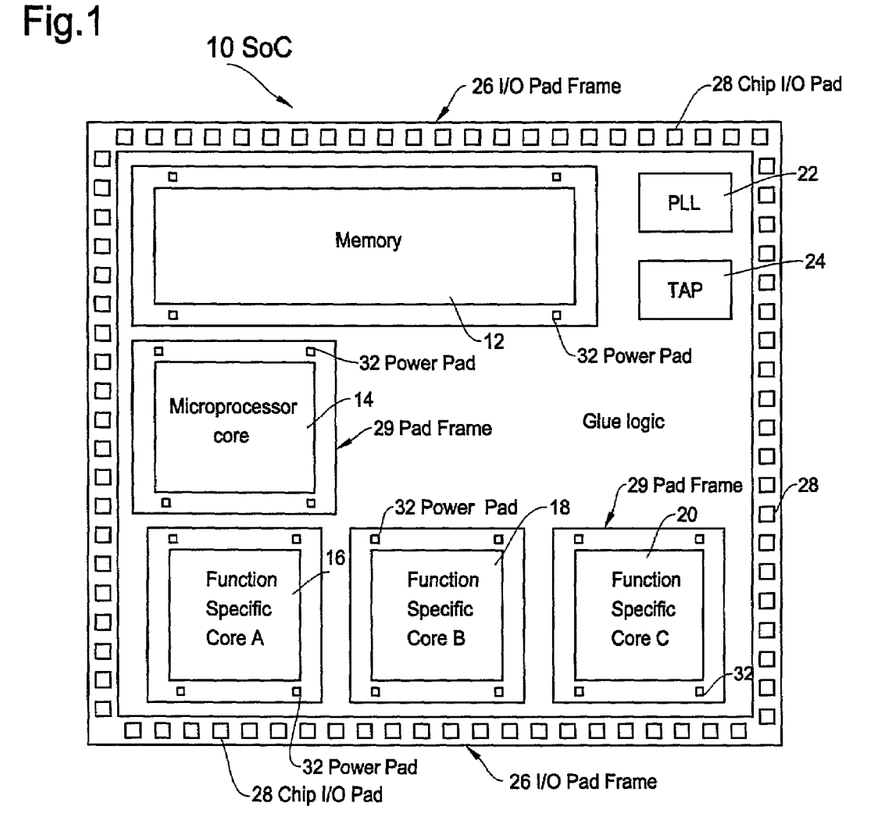
FIG. 1 is a schematic diagram showing an example of structure in a complex IC such as a system-on-a chip IC for design validation thereof.

An example of such a complex IC is a system-on-a-chip (SoC) which is an IC designed by stitching together multiple stand-alone VLSI designs (cores) to provide full functionality for an application. FIG. 1 illustrates an example of general structure of an SoC 10 that has an embedded memory 12, a microprocessor core 14, and three function-specific cores 16, 18 and 20, PLL (phase lock loop) 22 and TAP (test access port) 24. In this example, chip level I/Os are established as chip I/O pads 28 formed on a I/O pad frame 26 at the outer periphery of SoC 10. Each of the cores 12, 14, 16, 18 and 20 includes a pad frame 29 which typically contains multiple I/O pads at its periphery with power pads on the top metal layer.

Design validation is one of the most important tasks in any system design project such as a design of SoC 10 noted above (R. Rajsuman, "System-on-a-Chip: Design and Test"). Design validation means establishing that the system does what it intended to do. It essentially provides a confidence in system operation. The objective of validation is to prove that the product indeed works as intended (find out if it works as intended). Design validation of complex ICs can be considered as validation of hardware operation, which includes both functionality and timing performance. In the present day technology, it is obtained by extensive behavioral, logic and timing simulation; and/or by emulation; and/or by hardware prototype.

In the early phase of an IC design, along with the specification development and RTL coding, behavioral models are developed so that the testbenches can be created for system simulation. In the early phase, the objective is generally to develop a good set of test suites and test cases by the time RTL and functional models are specified. Efficient validation depends on the quality of test and completeness of testbenches, the abstraction level of various models, EDA tools and the simulation environment.

Figure 2:
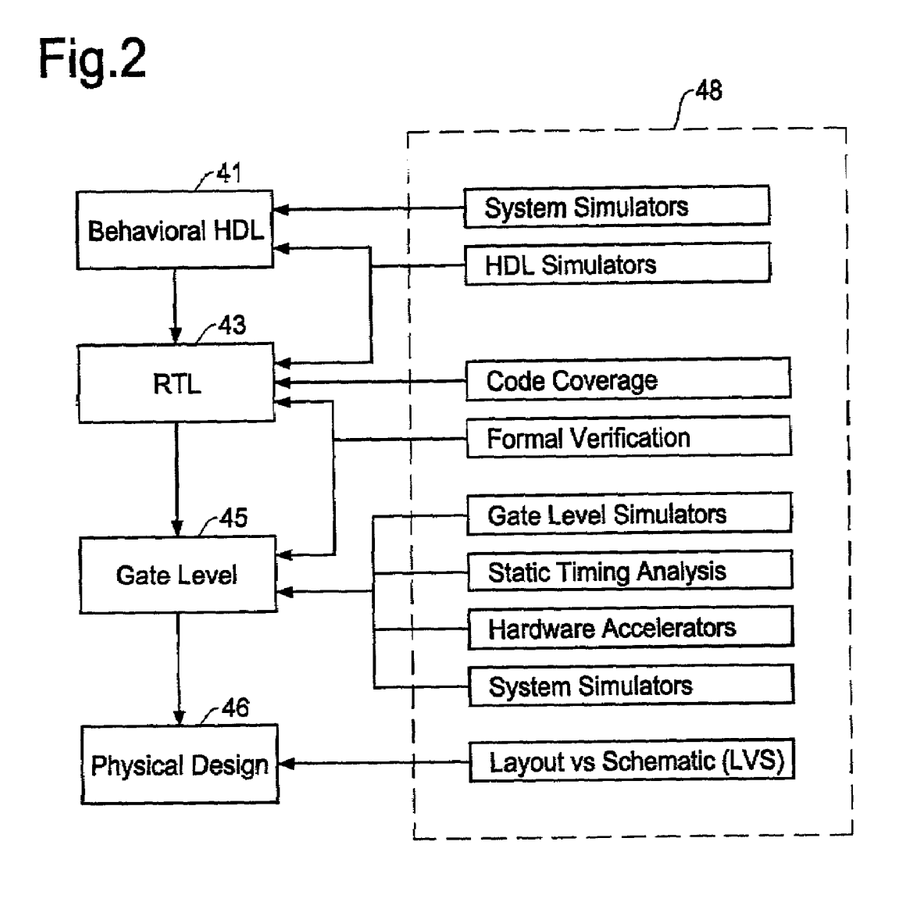
FIG. 2 is a schematic diagram showing an example of validation hierarchy corresponding to the design hierarchy involved in the design procedure under the EDA environment.

FIG. 2 illustrates the complex IC design at different levels of abstraction and what type of verification methodology is used today at each level. From the highest to lowest abstraction levels, FIG. 2 shows behavioral HDL level 41, RTL (register transfer language) level 43, gate level 45 and physical design level 46. Verification methods corresponding to such different abstraction levels are listed in a block 48 of FIG. 2.

The design validation strategy follows design hierarchy. First the leaf level blocks are checked for correctness in a stand-alone way. After functionality checking of these blocks, the interfaces between the blocks are checked for correctness in terms of transaction types and in data contents. The next step is to run application software or equivalent testbenches on full-chip model. As application of software can only be verified by runtime executions of the software, a hardware-software co-simulation is required. Co-simulation can be done at an instruction set architecture (ISA) level, a bus functional model (BFM) level or using a behavioral C/C++ model.

Figure 3:
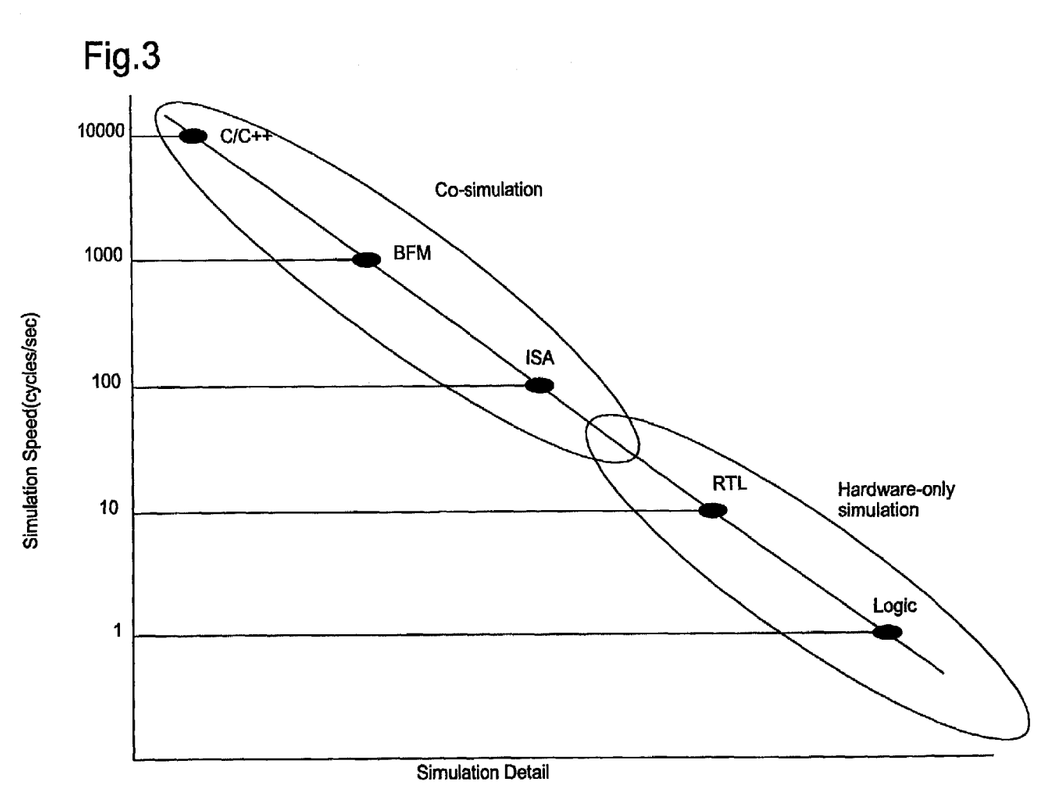
FIG. 3 is a diagram showing a relationship between the simulation speeds and various abstraction levels involved in the design process for complex IC.

An approximate comparison of simulation speed at different levels is shown in FIG. 3. Because of the slow co-simulation speed, at the present time, emulation and/or hardware prototypes are used. Emulation speed is much faster than the speed of co-simulation, although emulation is quite expensive (in general, emulation system cost on the order of 1 million dollars). Emulation can be close to $\frac{1}{100}$ of the actual system speed (roughly about 1,000,000 cycles/sec) FPGA (field programmable gate array) or ASIC (application specific integrated circuit) based hardware prototype provides even faster simulation speed, up to $\frac{1}{10}$ of the actual system speed, but it is even more expensive than emulation as it requires manufacturing of FPGAs or ASICs.

Despite the best attempt by engineers to make the first silicon fully functional, only about 80% designs work correctly when tested at the wafer level, but more than half fail when put into the system for the first time. The primary reason is the lack of system level testing with sufficient amount of real application run. The only means to do it in the present day technology is by silicon prototypes using either FPGA or ASIC.

Figure 4:
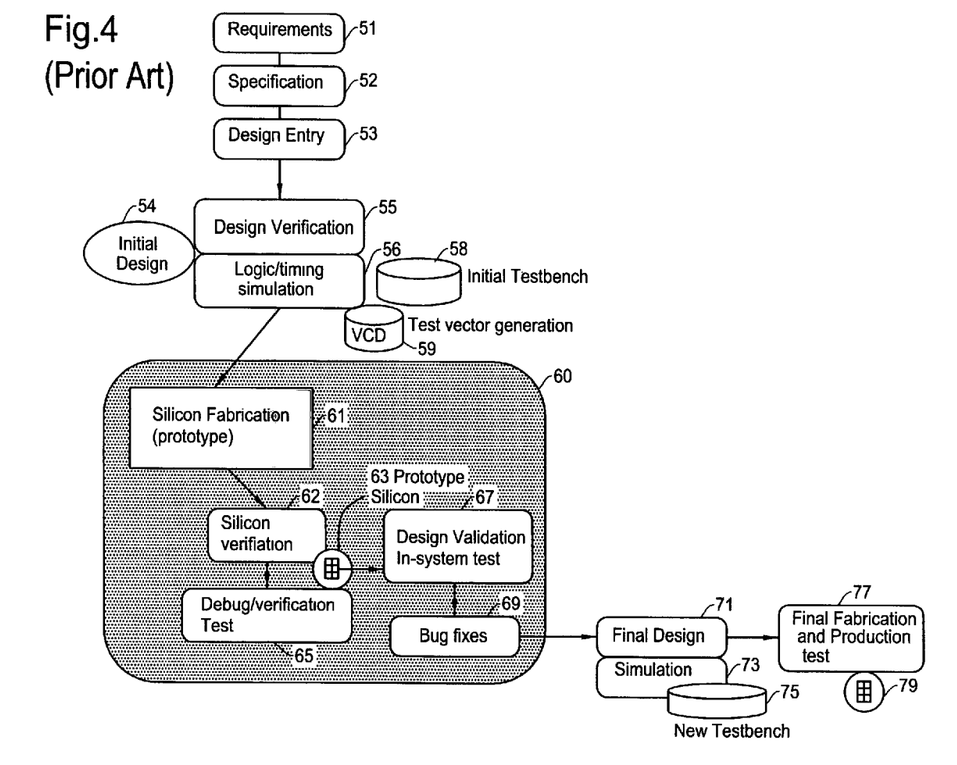
FIG. 4 is a flow diagram showing a product development process for a complex IC including a design validation process under the conventional technology.

An example of the present day product development cycle is illustrated in FIG. 4. At stage 51, designers study the requirements of a complex IC to be designed. Based on the requirements in the stage 51, the designers determine the specifications of the IC at stage 52. In the design entry process in stage 53, the IC is described in blocks and sub-blocks using a high-level language such as Verilog/VHDL. In stage 54, an initial design evaluation is made through design verification 55 and logic/timing simulation 56 with use of initial testbenches 58. As a result of executing the logic simulation, an input/output data file or VCD (value change dump) file 59 will be created. The data in the VCD file 59 is a list of input and output events with respect to time lengths or delays, i.e., data in an event format.

As shown in FIG. 4, when design is too large, building a silicon prototype and debugging it in the final system is the only method available today that is practical in comparison to extended verification and co-simulation. Such silicon prototype fabrication, verification and bug fix processes are illustrated in a shaded area 60 of FIG. 4. In this process, at stage 61, fabrication is done to obtain a silicon prototype 63.

The resultant silicon prototype 63 is examined in stage 62 for any error, these errors are debugged in debug and verification test 65.

Today, such test is carried out with use of an IC tester which is a cycle based test system having an architecture for generating test vectors based on test pattern data in a cycle format. Since cycle based test systems (ATE systems) are not able to directly utilize the testbench 58 or VCD file 59 produced under the EDA environment, such verification by IC testers today involves incomplete and inaccurate results. It is also time consuming to convert the event format data from the EDA environment to the cycle format test pattern data for the cycle based test system.

The silicon prototype 63 is further validated through an in-system test 67 wherein the silicon prototype 63 is tested as a part of an intended system. Suppose that the particular design is a chip to be installed in a cellular phone, the silicon prototype representing the chip will be mounted on a board of the cellular phone and is tested based on intended functions and performances of the cellular phone. During the in-system validation, errors and causes of the errors will be detected and the design bugs will be fixed in stage 69. Since such an in-system test requires both a silicon prototype of the designed chip and a system with application software to run the silicon prototype, it is not only costly but also time consuming.

During the silicon verification and the in-system test in the shaded area 60 in FIG. 4, design errors are found and causes of such errors are determined and design errors are corrected through repeated interactions between design engineers and test engineers. The final design 71 will be reached and the logic/timing simulation 73 for the final design 71 will be conducted with use of a new testbench 75. Then the design will be fabricated to silicon 79 and a production test 77 will be performed on the silicon 79.

In the foregoing process with silicon prototype, same silicon can be used for first several bugs without new silicon run. However, deciding when to use silicon prototype is an important decision as silicon prototype is a costly proposition. The following factors are considered in silicon prototyping:

(1) Diminishing bug rate in verification and co-simulation. When the basic bugs are eliminated, extensive application run will be required to find other bugs. Co-simulation and emulation may not be able to run application for extensive time periods.

(2) Difficulty in finding a bug. If finding a bug takes few orders of magnitude more time than the time to fix it, then silicon prototype is very useful, as it will help finding bugs quickly.

(3) Cost (manual effort, time-to-market) of finding bugs. If finding a bug in co-simulation or emulation is extremely costly, then silicon prototyping becomes necessary.

For smaller designs, FPGA/LPGA (field programmable gate-array/laser programmable gate-array) prototypes are adequate. LPGAs allow re-programmability so the bug fixes can be re-tested, while FPGAs offer higher speeds and higher gate counts than LPGAs. Both FPGA and LPGA lack the gate count capacity and speed of ASICs, thus they are good for smaller blocks, but not suitable for a large complex chip.

Several FPGAs can be used to build a prototype of a large complex chip, while each FPGA implements a portion of the chip. In this case, if bug fix demands re-partitioning of the chip, interconnects between FPGAs may require change and hence modifications can be complex. A partial solution of this problem is to add custom programmable routing chips to interconnect FPGAs. With programmable routing chips, if the interconnects change, new routing can be done under software control.

In a prototype design flow, after the study of the system behavior, simulated HDL (Verilog/VHDL) and/or C-programs description is used in co-synthesis. Similar to co-simulation, co-synthesis means the simultaneous development of the hardware and software. The purpose of co-synthesis is to produce C-code and hardware that will execute on a real architecture. In general, this step consists of mapping the system onto a hardware-software platform that includes a processor to execute the software and a set of ASICs to realize the hardware. The final prototype is generated by using the C-code of the software parts and by using logic synthesis, placement and routing to create the hardware components. Synthesis tools translate the HDL descriptions/models into gate-level netlist that are mapped to FPGAs or ASICs as prototypes.

The design validation method in the conventional technology described above is either extremely high in cost (e.g., method using a silicon prototype) or extremely slow in speed (e.g., method using a co-simulation). The design validation method today involves different formats between the EDA environment and the tester environment, and thus not able to perform the design validation with high efficiency and accuracy. Further, the design validation method today requires the in-system test as noted above which involves hardware and software to run the design in an intended system and requires significant feedbacks and interactions between the test environment and the design environment, resulting in a long turnaround time.

SUMMARY OF THE INVENTION

It is, therefore, an object of the present invention to provide a method for design validation of complex IC which is very efficient, less costly and fundamentally different than any previously described system.

It is another object of the present invention to provide a method for evaluating and validating the design of a complex IC at high speed and accuracy with use of a combination of electronic design automation (EDA) tools and an event based test system.

It is a further object of the present invention to provided a method for design validation of complex IC which achieves a complete loop from design entry to simulation and testbench generation, thereby permitting to verify the design and to correct any design error.

In the first aspect of the present invention, the method of validating design of complex IC includes the steps of: building prototype silicon based on IC design data produced under the EDA environment; applying test vectors derived from the IC design data to the prototype silicon by an event based test system and evaluating the response output of the prototype silicon; modifying test vectors by the event test system to acquire desired response outputs from the silicon prototype; and feedbacking the modified test vectors to the EDA environment to modify the IC design data, thereby correcting design errors in the IC design data.

The method further includes a step of linking EDA tools including a simulator with the event based test system through a software interface, and a step of extracting event format data through a testbench produced in the IC design data. The step of extracting the event format data further includes a step of executing the testbench by the simulator and extracting the event formate data from a value change dump file produced by the simulator.

The method further includes a step of installing the extracted event data in the event test system and generating test vectors using the extracted event data by the event based test system to apply the test vectors to the prototype silicon, and a step of creating a new testbench based on the modified test vectors from the event based test system.

The EDA tools includes means for viewing and editing waveforms derived from the testbench created in the IC design data. The event based test system includes means for viewing and editing waveforms in test vectors extracted from a testbench created in the IC design data and means for changing clock rate and event timing data of the test vectors applied to the prototype silicon.

In the second aspect of the present invention, the method of validating design of complex IC utilized a device model rather than the silicon prototype. The method include the steps of: preparing a device model of an IC to be designed based on IC design data produced under the EDA environment; applying test vectors derived from the IC design data to the device model by an event based test system and evaluating the response output of the device model; modifying test vectors by the event test system to acquire desired response outputs from the device model; and feedbacking the modified test vectors to the EDA environment to modify the IC design data, thereby correcting design errors in the IC design data.

According to the present invention, design validation is conducted through a method in which the IC simulation model and initial simulation testbench is used together with electronic design automation (EDA) tools to design verification using event based test system. For this purpose, the EDA tools and device simulator are linked to the event based test system to execute the original design simulation vectors and testbench and make modifications in the testbench and test vectors until satisfactory results are obtained. Because EDA tools are linked with the event based test system, these modifications are captured to generate a final testbench that provides satisfactory results. Accordingly, the design validation of the complex IC is achieved without conducting an in-system test of the silicon prototype. Further, the design validation of the complex IC is achieved without using the silicon prototype but using the design model. Therefore, the present invention can achieve significant reduction in the cost and turn around time.

DETAILED DESCRIPTION OF THE INVENTION

In the previous applications owned by the same assignee of this invention, an event based test system is described in U.S. patent application Ser. No. 09/406,300 (now U.S. Pat. No. 6,532,561) and Ser. No. 09/340,371 (now U.S. Pat. No. 6,678,643) "Event based semiconductor test system" and an event based design validation station is described in U.S. patent application Ser. No. 09/428,746 (now U.S. Pat. No. 6,678,645) "Method and apparatus for SoC design validation". Further, a time scaling technology is described in U.S. patent application Ser. No. 09/286,226 (now U.S. Pat. No. 6,557,133) "Scaling logic for Event Based Test System". All of these patent applications are incorporated by reference.

In the present invention, the inventors provide a concept for IC design verification method using the event based test system. More specifically, in the first embodiment, a method is described for design verification with silicon prototype, and in the second embodiment, a method is described without using silicon prototyping. Both methods of the present invention are faster and cheaper in comparison to any present day method.

The present invention proposes that the IC simulation model and initial simulation testbench is used together with electronic design automation (EDA) tools to design verification using event based test system (design test station (DTS)). For this purpose, the EDA tools and device simulator are linked to the event based test system to execute the original design simulation vectors and testbench and make modifications in the testbench and test vectors until satisfactory results are obtained. Because EDA tools are linked with the event based test system, these modifications are captured to generate a final testbench that provides satisfactory results. Since various modified test vectors can be applied to the prototype silicon or design model, complete design validation can be achieved without the in-system test shown in FIG. 4.

Figure 5:
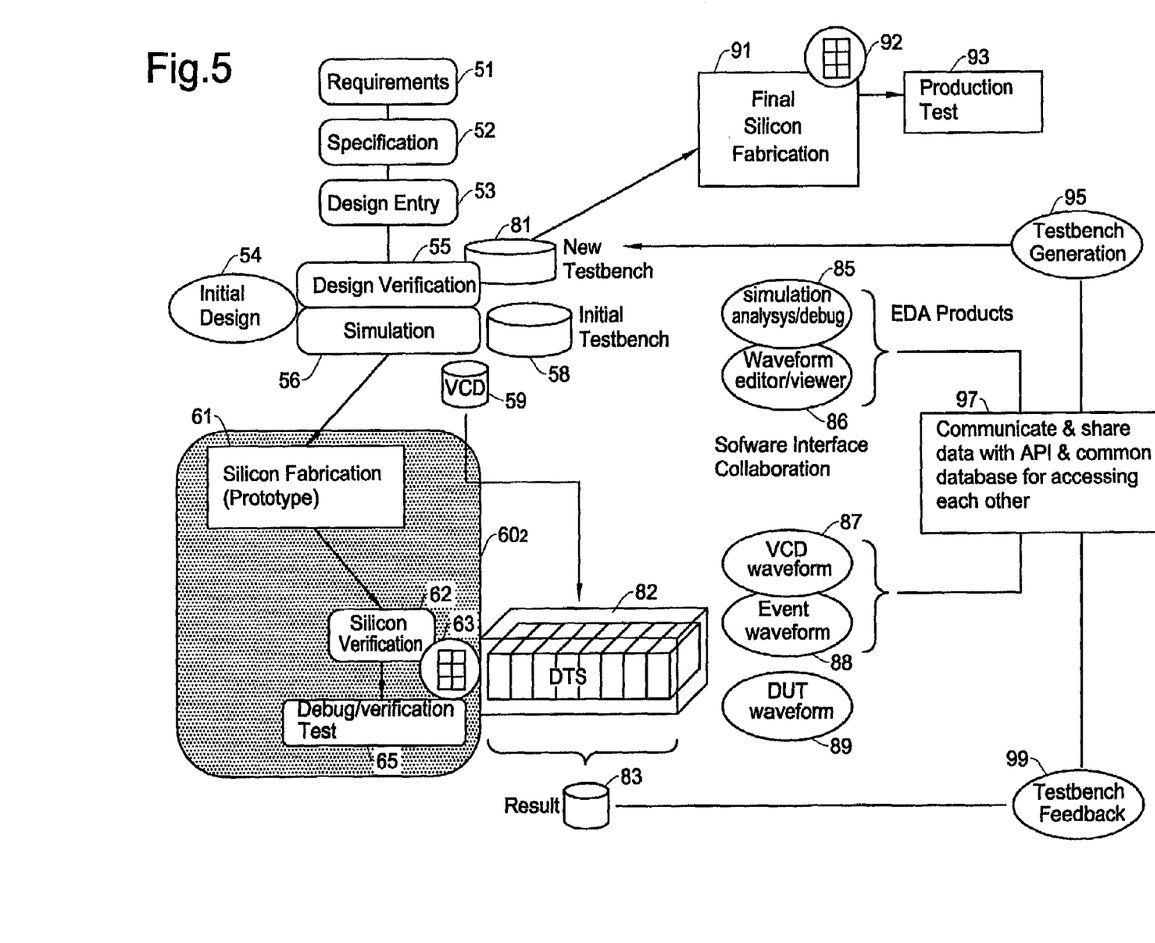
FIG. 5 is a schematic diagram showing a method of design validation for complex IC in the first embodiment of the present invention.

The complete verification process in the first embodiment of the present invention is illustrated in FIG. 5. For full functional verification of IC, the IC level functional vectors developed during design simulation (initial testbench 58) are executed on an event based test system 82. These vectors are also in the event format. Many times these event format test vectors are generated by the software application running on the Verilog/VHDL model or behavioral model of the IC (design). These vectors exercise different parts of the IC simultaneously or at different time, however, the overall behavior of the IC is determined by the combined response.

Generally, after this step, a silicon chip (silicon prototype) 63 is fabricated as shown in FIGS. 4 and 5. Once this chip becomes available, it is put on the event based test system and design simulation vectors of initial testbench are executed to verify the chip's operation. The results are examined on the event based test system and events are changed/edited on the event based test system until all incorrect operations of the IC (intended design) are rectified. These changes in the events are feedbacked to generate new testbench and test vectors. After these processes, final silicon fabrication is done to produce final devices.

More specifically, in the example of FIG. 5, a design test station (DTS) 82 is an event based test system provided to test the function of the silicon prototype 63 using the test vectors produced based on the event data derived from a VCD (value change dump) file 59. The VCD file 59 is produced by executing the design verification 55 and simulation 56 on the initial design 54 with use of an initial testbench 58. Since the testbench 58 is created in the event format and the resultant VCD file 59 is also in the event format, the data in the VCD file 59 can be directly used in the event based test system 82 to test the design.

The EDA tools such as simulation analysis/debug 85 and waveform editor/viewer 86 are linked to the design test station (DTS) 82 through an interface 97 in FIG. 5. An example of simulation analysis/debug is VCS by Synopsys and ModelSim by Mentor Graphics. An example of waveform editor/viewer is SIGNALSCAN by Cadence and VirSim by Synopsys. Further, an example of such an interface is API (programmed application interface).

The event based test system 82 incorporates software tools for editing and viewing waveforms such as VCD waveform editor/viewer 87, event waveform editor/viewer 88 and DUT (device under test) waveform editor/viewer 89. In this example, the editor/viewer 87 and 88 are linked to the EDA tools 85 and 86 through the API interface 97 for communicating and accessing common data base with one another. In the event based test system, for example, an event may be inserted in a particular timing or an edge timing of an event may be changed through the event waveform editor/viewer 88.

By executing the test vectors, the event based test system 82 produces a test result file 83 which is feedbacked to the EDA design environment and to the EDA tools through a testbench feedback 99. Because the simulation speed is much slower (on the order of 10 KHz) in comparison to speed of event based test system (on the order of 100 MHz), timing in initial testbench and test vectors is scaled. The event based test system enables to edit events and scaling of timing, the method and apparatus is described in the patent applications noted above.

The results are examined on the event based test system and events are changed/edited on the event based test system (editor/viewer 87, 88 and 89) until all incorrect operations of the device (intended design) are rectified. These changes in the events create a new testbench 81. As noted above, to obtain such a new testbench and test vectors, EDA tools consisting of testbench generation tools 95, simulation analysis tools 85 and waveform viewer 86 are linked to the event based test system. This test method enables to capture all the event edits into the new test vectors and testbench 81 through the testbench generation tool 95.

In the foregoing embodiment of the present invention, the event format test vectors resulted from the testbench 58 are generated by the event based test system at a rate, for example, 10,000 times higher than a simulator. This is done by the scaling function of the event based test system in which an event clock and event timing data are multiplied by a predetermined factor. Thus, when the silicon prototype 63 is connected to the event test system, the silicon prototype 63 is tested at very high speed. Since the data concerning the silicon prototype 63 is now copied in the event test system, the modification of test vectors and the resultant response or changes in the design can be conducted in the event test system at high speed. The test results and the modification of the test vectors and design are feedbacked to the EDA tools 85, 86 and the testbench 81.

After these processes, final silicon fabrication is done at stage 91 to produce the final IC device 92 which will be tested in a production test stage 93. These test vectors and new testbench 81 are required and used during manufacturing test to detect any fabrication defects. Overall, this new procedure provides a complete loop from design entry to simulation and testbench generation and thus, permits to verify the design and to correct any errors therein.

The first embodiment of the present invention is described above with reference to FIG. 5. In the first embodiment, the verification process includes generation of a testbench that corresponds to correct device operation. One restriction in the first embodiment is that it still requires physical silicon (silicon prototype 63) that is put on the event based test system for verification. Because of the need of physical silicon, process in the first embodiment is still costly.

Accordingly, in the second embodiment of the present invention, the basic concept in the first embodiment is improved by eliminating the need of physical silicon. The process in the second embodiment uses the initial design description and its simulation testbench to generate a new testbench and a corresponding device model that is bug free. This device model can be used for mass production as it includes all corrections in the device operation. The complete process is illustrated in FIG. 6.

Figure 6:
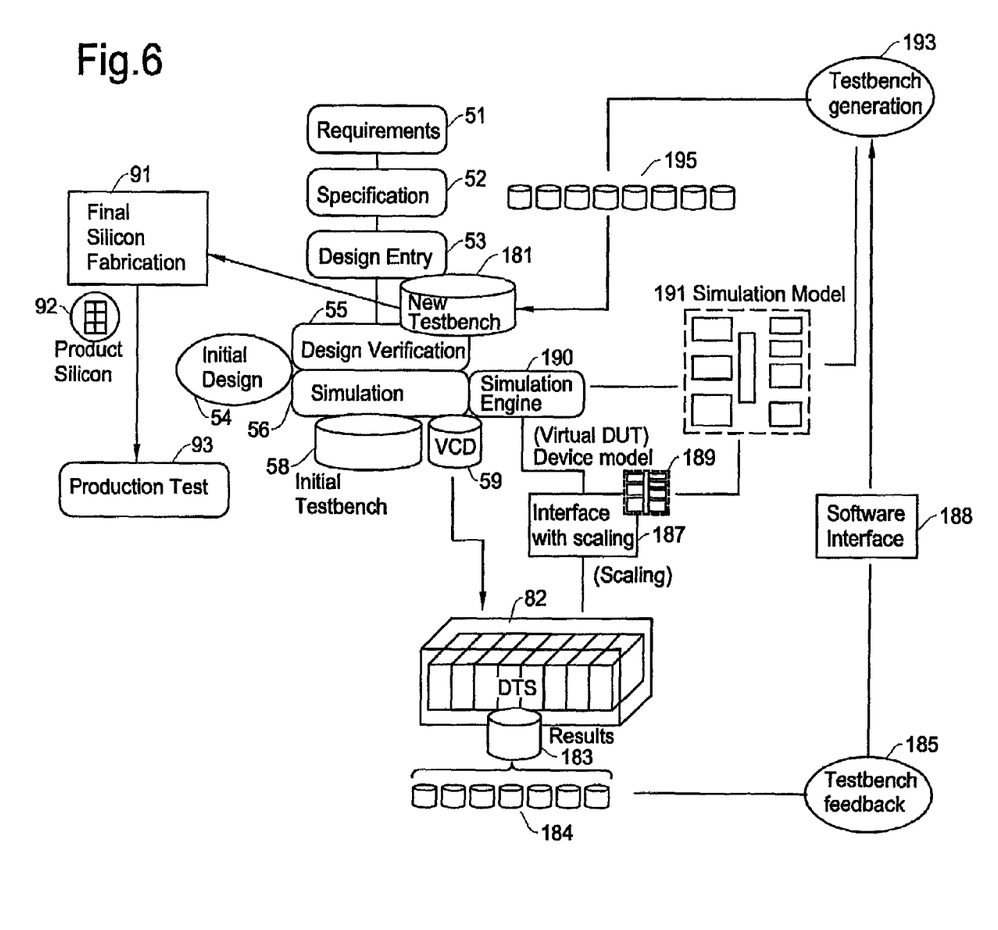
FIG. 6 is a schematic diagram showing a method of design validation for complex IC in the second embodiment of the present invention.

The major difference between the embodiments in FIG. 5 and FIG. 6 is that, in FIG. 5, prototype silicon is loaded on the event based test system along with the initial testbench. In FIG. 6, a device model (virtual DUT) 189 is created based on the initial design and simulation 56 and initial testbench 58. The device model 189, rather than the physical silicon, is put on the event based test system. For the purpose of the present invention, the device model 189 may be independent from any particular simulator, or may be dependent (simulation model 191) of a particular simulator.

Using the programmed application interface (API), such as an interface 187 in FIG. 6, the event based test system is also linked with the simulation engine (simulator) 190 that was used during the initial design. The interface 187 preferably includes a scaling function wherein the clock rate and event timing data of the test vectors from the simulation engine 190 can be multiplied by a desired factor. Consequently, the test vectors can be executed at high speed, for example, 100 MHz in the event based test system 82.

In this arrangement, the event based test system contains the design described in Verilog/VHDL and its all logic, behavioral, BFM (bus functional model), ISA (instruction set architecture) and application testbenches. It should be noted that these testbenches are not limited to Verilog/VHDL; system can execute testbenches described in C/C++ as well because it is linked with simulator. Various EDA tools and test system tools shown in FIG. 5 are also connected with one another.

Using the device model (initial design) 189 and its testbenches 58, the results are examined on the event based test system (design test station: DTS) 82. Because the whole environment and results are in the event format, any incorrect operation in the device operation is quickly noticed. As event based test system is able to edit events and time scaling as noted above, the events corresponding to these incorrect operations are edited to correct the operation.

When all incorrect operations are corrected, the device model is saved and a new testbench and test vectors 181 are generated. The procedure of testbench and test vector generation is the same in FIGS. 5 and 6 where the illustration in FIG. 6 is simplified to avoid cluttering of diagram. Thus, a software interface 188 is the same as the interface 97 of FIG. 5 and the EDA tools 85, 86 and the event test system tools 87, 88 and 89 are connected through the software interface 188. In case where the particular design is directed to an SoC, a plurality of test result files 184 and testbench files 195 may be created as shown in FIG. 6 corresponding to the cores in the SoC.

This saved device model is used for silicon fabrication. As it has already been validated on the event based test system, it requires no further validation. To check any fabrication defects, it only requires normal production testing for which test vectors are also available (during the step of testbench and test vector generation).

The procedure described with reference to FIG. 6 does not require any hardware prototype or emulation for design validation. The initial design with limited simulation is used on the event based test system to generate a new device model that includes all corrections in the device operation. The procedure also provides corresponding new testbenches and test vectors necessary for manufacturing testing. The procedure provides a complete loop from design entry and simulation to design validation without the need of physical silicon and therefore it is extremely cost effective in comparison to existing methods and the first embodiment.

Figure 7:
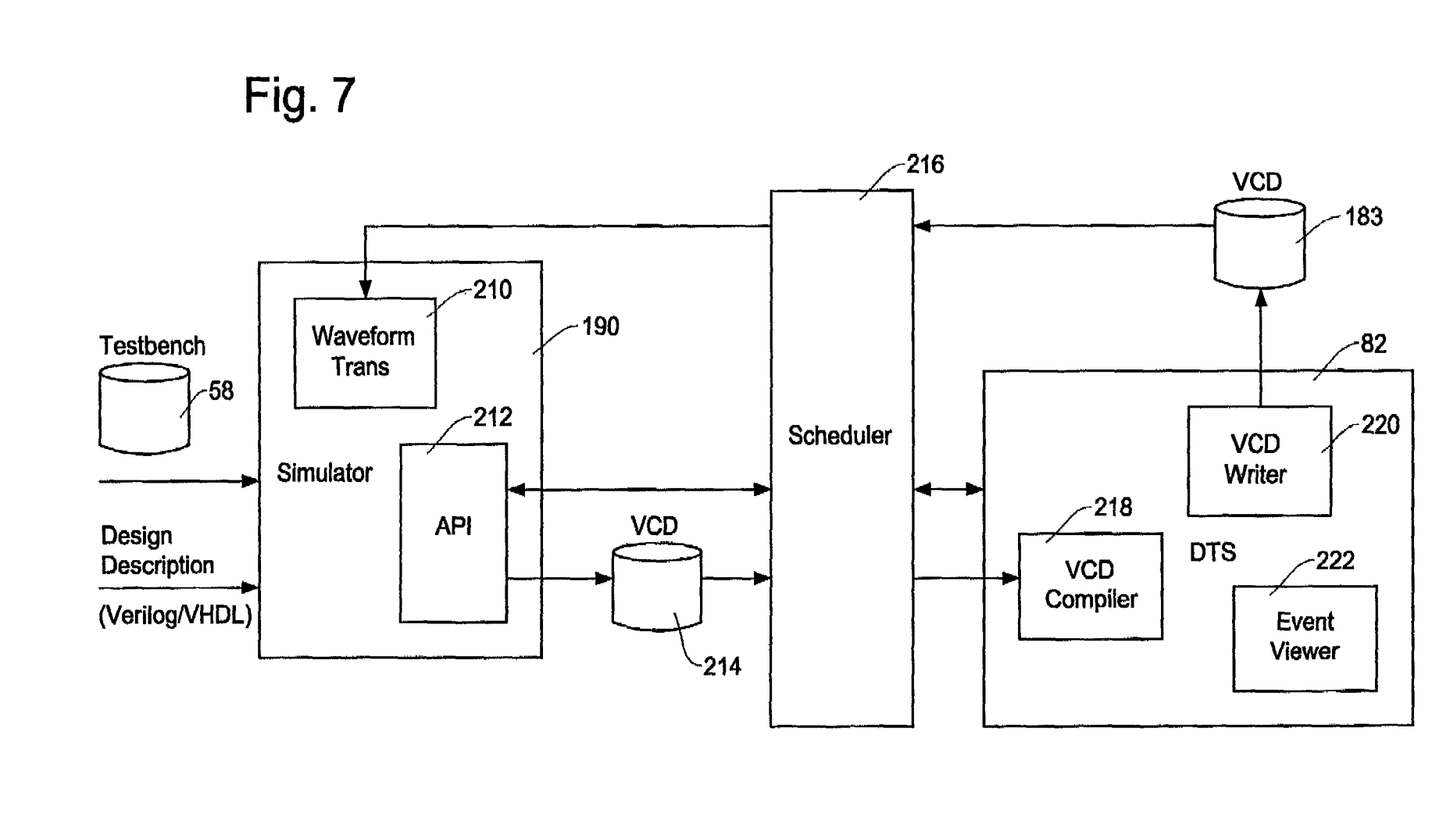
FIG. 7 is a schematic diagram showing an example of connection between the EDA tools and the event based test system in the embodiments of FIGS. 5 and 6.

FIG. 7 shows an example of relationship between the EDA simulation engine and the event based test system. In this example, the simulation engine (simulator) 190 includes a waveform translator 210 and an API interface 212. The waveform translator 210 allows waveform viewing by the simulator. The API interface 212 is provided to interface between different formats.

The event based test system (design test station DTS) 82 includes a VCD compiler 218, an event viewer 222, and a VCD writer 220. The VCD compiler 218 translates the VCD data to event data for use by the event based test system 82. The event viewer 222 and the VCD writer 220 correspond to the VCD waveform viewer/editor 87 and event waveform editor/viewer 88 in FIG. 5 to monitor and modify the event based test vectors. A scheduler 216 is provided to monitor and manage tasks and communication between the event test system 82 and the simulator 190.

The API interface 212 links various software tools with different formats in the simulator engine 190 and the event based test system 82. The event waveforms at the event based test system (DTS) 82 are monitored and edited through the event viewer 222. The modified event waveforms are converted to VCD by the VCD writer 220. The waveform translator 210 converts the waveform of the VCD to waveforms of the simulation engine 190.

According to the present invention, design validation is conducted through the method in which the IC simulation model and initial simulation testbench is used together with electronic design automation (EDA) tools to design verification using event based test system. The EDA tools and device simulator are linked to the event based test system to execute the original design simulation vectors and testbench and make modifications in the testbench and test vectors until satisfactory results are obtained. Because EDA tools are linked with the event based test system, these modifications are captured to generate a final testbench that provides satisfactory results. Accordingly, the design validation of the IC is achieved without conducting an in-system test of the silicon prototype. Further, the design validation of the complex IC is achieved without using the silicon prototype but using the design model. Therefore, the present invention can achieve significant reduction in the cost and turn around time.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method of validating design of complex integrated circuits (IC) where a design process is carried out under electronic design automation (EDA) environment, comprising the following steps of:

building prototype silicon based on IC design data produced under the EDA environment;

preparing event based test vectors based on the IC design data produced in the EDA environment;

applying the event based test vectors derived from the IC design data to the prototype silicon by an event based test system and evaluating the response output of the prototype silicon, where the event based test vectors are test vectors in an event format in which an event is any change in a signal which is described by its timing which represents a time difference between two adjacent events and the event based test system is a test system for testing an IC by utilizing the event based test vectors;

modifying the event based test vectors by the event based test system to acquire desired response outputs from the silicon prototype; and feedbacking the modified event based test vectors to the EDA environment to modify the IC design data, thereby correcting design errors in the IC design data.

2. A method of validating design of complex integrated circuits as defined in claim 1, wherein said step of preparing the event based test vectors includes a step of linking EDA tools including a simulator with the event based test system through a software interface.

3. A method of validating design of complex integrated circuits as defined in claim 1, wherein said step of preparing the event based test vectors includes a step of extracting event format data through a testbench produced in the IC design data.

4. A method of validating design of complex integrated circuits as defined in claim 3, wherein said step of extracting the event format data includes a step of executing the testbench by the simulator and extracting the event format data from a value change dump file produced by the simulator.

5. A method of validating design of complex integrated circuits as defined in claim 3, further comprising a step of installing the extracted event format data in the event based test system and generating event based test vectors using the extracted event data by the event based test system to apply the test vectors to the prototype silicon.

6. A method of validating design of complex integrated circuits as defined in claim 3, further comprising a step of creating a new testbench based on the modified event based test vectors from the event based test system.

7. A method of validating design of complex integrated circuits as defined in claim 3, wherein said EDA tools includes means for viewing and editing waveforms derived from the testbench created in the IC design data.

8. A method of validating design of complex integrated circuits as defined in claim 1, wherein said event based test system includes means for viewing and editing waveforms of event based test vectors extracted from a testbench created in the IC design data and means for changing clock rates and event timing data of the event based test vectors applied to the prototype silicon.

9. A method of validating design of complex integrated circuits (IC) where a design process is carried out under electronic design automation (EDA) environment, comprising the following steps of:
- building prototype silicon based on IC design data produced under the EDA environment;
- linking EDA tools including a simulator with an event based test system;
- extracting event format data from a value change dump file resulted from executing a testbench produced in the IC design data by the simulator;
- installing the extracted event data in the event based test system and generating event based test vectors using the event data by the event based test system;
- applying the event based test vectors to the prototype silicon and evaluating the response output of the prototype silicon, where the event based test vectors are test vectors in an event format in which an event is any change in a signal which is described by its timing which represents a time difference between two adjacent events and the event based test system is a test system for testing an IC by utilizing the event based test vectors;
- modifying the event based test vectors by the event based test system to acquire desired response outputs from the silicon prototype; and
- feedbacking the modified event based test vectors to the EDA tools to modify the design data, thereby correcting design errors in the design data;
- whereby validating the design of the IC without conducting an in-system test of the silicon prototype.

10. A method of validating design of complex integrated circuits (IC) where a design process is carried out under electronic design automation (EDA) environment, comprising the following steps of:
- preparing event based test vectors based on the IC design data produced in the EDA environment;
- applying event based test vectors derived from the IC design data to the device model by an event based test system and evaluating the response output of the device model, where the event based test vectors are test vectors in an event format in which an event is any change in a signal which is described by its timing which represents a time difference between two adjacent events and the event based test system is a test system for testing an IC by utilizing the event based test vectors;
- modifying the event based test vectors by the event based test system to acquire desired response outputs from the device model; and
- feedbacking the modified event based test vectors to the EDA environment to modify the IC design data, thereby correcting design errors in the IC design data.

11. A method of validating design of complex integrated circuits as defined in claim 10, wherein said device model is either dependent of a particular simulator or independent of any simulator.

12. A method of validating design of complex integrated circuits as defined in claim 10, wherein said step of preparing the event based test vectors includes a step of linking EDA tools including a simulator with the event based test system through a software interface.

13. A method of validating design of complex integrated circuits as defined in claim 10, wherein said step of preparing the event based test vectors includes a step of extracting event format data through a testbench produced in the IC design data.

14. A method of validating design of complex integrated circuits as defined in claim 13, wherein said step of extracting the event format data includes a step of executing the testbench by the simulator and extracting the event format data from a the value change dump file produced by the simulator.

15. A method of validating design of complex integrated circuits as defined in claim 13, further comprising a step of installing the extracted event format data in the event based test system and generating event based test vectors using the extracted event data by the event based test system to apply the event based test vectors to the device model.

16. A method of validating design of complex integrated circuits as defined in claim 13, further comprising a step of creating a new testbench based on the modified event based test vectors from the event based test system.

17. A method of validating design of complex integrated circuits as defined in claim 13, wherein said EDA tools includes means for viewing and editing waveforms derived from the testbench created in the IC design data.

18. A method of validating design of complex integrated circuits as defined in claim 10, wherein said event based test system includes means for viewing and editing waveforms of event based test vectors extracted from a testbench created in the IC design data and means for changing clock rates and event timing data of the event based test vectors applied to the device model.

19. A method of validating design of complex integrated circuits (IC) where a design process is carried out under electronic design automation (EDA) environment, comprising the following steps of:
- preparing a device model of an IC to be designed based on IC design data produced under the EDA environment;
- linking EDA tools including a simulator with an event based test system;
- extracting event format data from a value change dump file resulted from executing a testbench produced in the IC design data by the simulator;
- installing the extracted event data in the event test system and generating event based test vectors using the event data by the event based test system;
- applying the event based test vectors to the device model and evaluating the response output of the device model, where the event based test vectors are test vectors in an event format in which an event is any change in a signal which is described by its timing which represents a time difference between two adjacent events and the event based test system is a test system for testing an IC by utilizing the event based test vectors;
- modifying the event based test vectors by the event test system to acquire desired response outputs from the device model; and
- feedbacking the modified event based test vectors to the EDA tools to modify the design data, thereby correcting design errors in the design data.

* * * * *